(12) United States Patent
Sonderman et al.

(10) Patent No.: US 7,402,257 B1
(45) Date of Patent: Jul. 22, 2008

(54) PLASMA STATE MONITORING TO CONTROL ETCHING PROCESSES AND ACROSS-WAFER UNIFORMITY, AND SYSTEM FOR PERFORMING SAME

(75) Inventors: Thomas J. Sonderman, Austin, TX (US); Richard J. Markle, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 1088 days.

(21) Appl. No.: 10/209,585

(22) Filed: Jul. 30, 2002

(51) Int. Cl.
*G01R 31/00* (2006.01)

(52) U.S. Cl. .............................. 216/60; 216/61; 216/67

(58) Field of Classification Search .................. 216/60, 216/61, 67; 700/1, 28–33, 121, 266, 303; 438/5, 9, 10
See application file for complete search history.

(56) References Cited

U.S. PATENT DOCUMENTS

| | | | | |
|---|---|---|---|---|
| 6,081,334 A | * | 6/2000 | Grimbergen et al. | 356/499 |
| 6,136,214 A | * | 10/2000 | Mori et al. | 216/67 |
| 6,153,115 A | * | 11/2000 | Le et al. | 216/60 |
| 6,270,672 B1 | * | 8/2001 | Turecek et al. | 210/645 |
| 6,417,013 B1 | * | 7/2002 | Teixeira et al. | 438/5 |
| 6,455,437 B1 | * | 9/2002 | Davidow et al. | 438/710 |
| 6,509,249 B1 | * | 1/2003 | Liu et al. | 438/424 |

FOREIGN PATENT DOCUMENTS

| WO | WO 0129873 A1 | * | 4/2001 |
|---|---|---|---|
| WO | WO 0223289 A2 | * | 3/2002 |

* cited by examiner

*Primary Examiner*—Allan Olsen
(74) *Attorney, Agent, or Firm*—Williams, Morgan & Amerson

(57) ABSTRACT

The present invention is generally directed to plasma state monitoring to control etching processes and across-wafer uniformity, and a system for performing same. In one illustrative embodiment, the method comprises generating a plasma within an etching tool, monitoring at least one characteristic of the generated plasma, and controlling at least one parameter of a plasma etching process performed in the tool based upon the monitored at least one characteristic of the plasma. In another illustrative embodiment, the method comprises generating a plasma within an etch tool, performing a plasma etching process within the etch tool, determining at least one characteristic of the plasma, and controlling at least one parameter of the etching process based upon a comparison of the determined at least one characteristic of the plasma and a target value for the determined at least one characteristic of the plasma.

9 Claims, 2 Drawing Sheets

PLASMA STATE MONITORING TO CONTROL ETCHING PROCESSES AND ACROSS-WAFER UNIFORMITY, AND SYSTEM FOR PERFORMING SAME

BACKGROUND OF THE INVENTION

1. Field of the Invention

The present invention is generally related to the field of semiconductor manufacturing and, more particularly, to plasma state monitoring to control etching processes and across-wafer uniformity, and a system for performing same.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

As device dimensions have continued to decrease, the ability to precisely form very small features to their desired dimension has become more important. Variations in the physical dimensions of such features can adversely impact device performance and reduce product yields. For example, the critical dimension and profile of gate electrode structures of transistors is one area where a very high degree of precision is desired. Absent precise control, adverse consequences may follow. For example, if the critical dimension of the gate electrode is greater than the target or design critical dimension, the transistor may not operate as fast as desired by the product design requirements. Conversely, if the critical dimension of the gate electrode structure is less than the target value, off-state leakage currents may be higher than desired. This situation is particularly problematic for integrated circuit devices intended for mobile telecommunication applications and those intended for mobile computing devices.

Etching processes are frequently employed in semiconductor manufacturing to define a variety of different types of features, such as gate electrode structures, conductive metal lines, openings in insulating layers, trenches in a semiconducting substrate, sidewall spacers, etc. Such etching processes, be they anisotropic or isotropic in nature, are very complex processes that involve a vast variety of interrelated variables, such as gas flow rates, temperature, pressure, power, etc. Such complexities make it difficult to control etching processes such that the resulting features exhibit the desired physical dimensions and/or profile.

Moreover, in some cases, wafers exhibiting across-wafer irregularities are sent to an etch tool for processing. For example, a deposited layer of material may be thicker near an edge region of the wafer and relatively thinner near the central region of the wafer. This thickness variation may be due to a variety of factors. In that case, performing a standard etch process that is based upon the premise that the process layer on the incoming wafer exhibits substantially uniform across-wafer thickness characteristics may lead to severe process errors. For example, if a deposited layer is thicker near the edge of the wafer, an endpoint etch process may be performed for too long of a duration, thereby overetching the deposited area in the middle region of the wafer. Such overetching may cause undesirable damage to the underlying process layer or increase the likelihood that features formed in the deposited layer may exhibit less than desired profiles. As a result, the devices produced by such processes may produce completed integrated circuit devices of an unacceptable quality.

The present invention is directed to overcoming, or at least reducing the effects of, one or more of the problems set forth above.

SUMMARY OF THE INVENTION

The present invention is generally directed to plasma state monitoring to control etching processes and across-wafer uniformity, and a system for performing same. In one illustrative embodiment, the method comprises generating a plasma within an etching tool, monitoring at least one characteristic of the generated plasma, and controlling at least one parameter of a plasma etching process performed in the tool based upon the monitored at least one characteristic of the plasma.

In another illustrative embodiment, the method comprises generating a plasma within an etch tool, performing a plasma etching process within the etch tool and determining at least one characteristic of the plasma. The method further comprises controlling at least one parameter of the etching process based upon a comparison of the determined at least one characteristic of the plasma and a target value for the determined at least one characteristic of the plasma.

In yet another illustrative embodiment, the method comprises generating a plasma within an etch tool, performing an etching process within the etch tool to define at least one feature above a semiconducting substrate and determining a metric for the plasma, wherein the metric is based upon at least one characteristic of the plasma. The method further comprises controlling at least one parameter of the etching process based upon a comparison of the determined metric and a target metric for the plasma, the target metric being associated with at least one of a target profile and a target critical dimension for the at least one feature.

In a further illustrative embodiment, the method comprises generating a plasma in an etch tool, providing a substrate having a process layer formed thereabove to the etch tool, wherein the process layer has a thickness that varies across the substrate, and monitoring at least one characteristic of the generated plasma. The method further comprises controlling at least one parameter of a plasma etching process performed in the etch tool based upon the monitored characteristic of the plasma so as to perform an etch process in the etch tool that exhibits a desired across-substrate etch pattern that compensates for the across-substrate thickness variations in the process layer

BRIEF DESCRIPTION OF THE DRAWINGS

The invention may be understood by reference to the following description taken in conjunction with the accompanying drawings, in which like reference numerals identify like elements, and in which.

Figure 1:
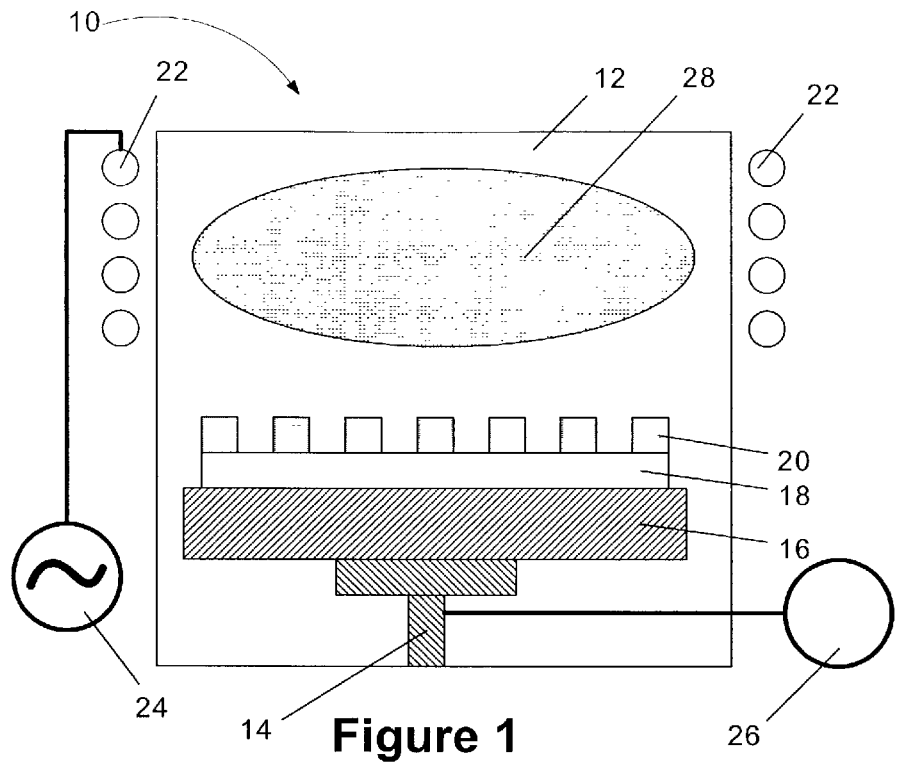
FIG. 1 is a cross-sectional, schematic depiction of an illustrative etch tool that may be employed with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various features of a semiconductor device are depicted in the drawings as having very precise, sharp configurations and profiles, those skilled in the art recognize that, in reality, these features are not as precise as indicated in the drawings. Additionally, the relative sizes of the various features depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to plasma state monitoring to control etching processes and across-wafer uniformity, and a system for performing same. As will be readily apparent to those skilled in the art upon a complete reading of the present application, the present methods are applicable to a variety of technologies, e.g., NMOS, PMOS, CMOS, SOI, etc., and the methods disclosed herein may be used in the formation of a variety of different types of integrated circuit devices, including, but not limited to, logic devices, memory devices, etc.

The present invention is generally directed to various control methodologies that may be employed in the context of forming a variety of different types of features during the course of manufacturing an integrated circuit product. For example, the present invention may be employed in the context of forming trench-type features or island-type features in an integrated circuit device. Even more specifically, the present invention may be employed in the context of forming features such as trenches in a semiconducting substrate, gate electrode structures, conductive metal lines, openings in layers of insulating material, etc. Thus, as will be appreciated by those skilled in the art after a complete reading of the present application, the present invention should not be considered as limited to any particular type of feature unless such feature type is specifically set forth in the appended claims.

FIG. 1 is a cross-sectional, schematic depiction of an etch tool 10 that may be employed with the present invention. As shown therein, the etch tool 10 is comprised of a process chamber 12, a wafer stage 14, an RF coil 22, an RF power source 24 and a DC power source 26. As will be appreciated by those skilled in the art, the etch tool 10 comprises many additional features, e.g., temperature sensors, pressure sensors, process gas inlets and outlets, means for providing one or more process gases to the tool 10, etc., which are not depicted so as to not obscure the present invention. A wafer 16, having a process layer 18 formed thereabove, is positioned above and secured to the wafer stage 14 by, for example, a vacuum source (not shown). After a complete reading of the present application, those skilled in the art will recognize that the present invention may be employed in etching a process layers 16 comprised of a variety of different materials, e.g., polysilicon, a metal, an insulating material, dielectric materials, etc. A patterned masking layer 20 is formed above the process layer 18. Of course, the present invention may be employed in situations where the patterned masking layer 20 is comprised of a photoresist material (positive or negative) as well as other so-called hard mask materials, e.g., silicon nitride.

A plasma, or glow discharge, 28 is generated in the etch tool 10 by, among other things, supplying RF power from the RF power source 24 to the coils 22 positioned proximate the process chamber 12. A plasma is generally understood to be a partially ionized gas containing an equal number of positive and negative charges as well as some number of neutral gas atoms and molecules. A glow discharge is generally understood to be a self-sustaining type of plasma. As will be appreciated by those skilled in the art after a complete reading of the present application, the present invention may be employed with any type of etch tool that generates and uses a plasma 28 in performing its intended functions. Moreover, the present invention may be employed with any of a variety of processes employing a plasma, such as, for example, plasma etching, reactive ion etching, inductively coupled plasma etching, etc. Additionally, as used herein, the term "plasma" should be understood to cover any glow discharge process or plasma process employed in semiconductor manufacturing operations. Thus, the present invention should not be considered as limited to any particular type of etch tool, etching process, or plasma, unless such limitations are clearly set forth in the appended claims.

The plasma 28 generated in the etch tool 10 may exhibit several characteristics. These characteristics include, but are not limited to, the mean free path of electrons generated by the plasma, the temperature of the electrons, the density of the plasma, the electric field, the dark space, the percentage of ionized gases, ionization potentials, the charges of the gases used in the plasma process (+, 2+, −, etc.), the stoichiometric chemical composition of the plasma and the plasma feed gases, the presence and/or absence of specific chemical species, molecules or atoms, floating potential, electron mobilities, sheath voltage, discharge diameter, magnetic moment, debye length, etc. Thus, the present invention should not be considered as limited to monitoring or using any specific parameter or characteristic of the plasma unless such limitations are expressly set forth in the appended claims.

There are products in the marketplace that may be used to obtain data about the characteristics of the plasma 28. For example, optical emission spectrometry tools, mass spectrometry tools, langmier probes, RF sensors, etc., may be employed to obtain data about the characteristics of the plasma 28. These types of tools may be obtained from a variety of known vendors. Once obtained, this data regarding the characteristics of the plasma 28 may be used in accordance with the methods described herein.

Figure 2:
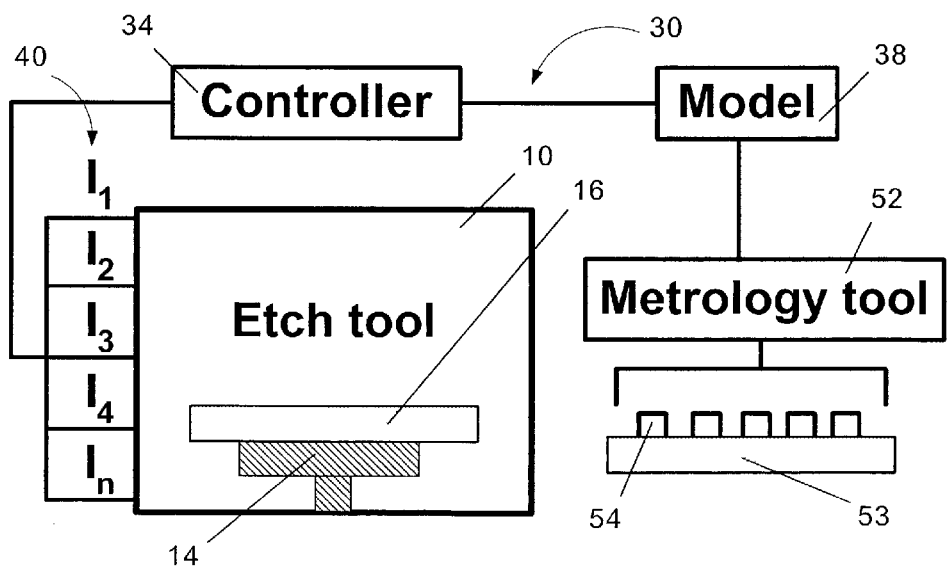
FIG. 2 is a block diagram, schematic depiction of a system in accordance with one illustrative embodiment of the present invention.

FIG. 2 depicts an illustrative system 30 that may be employed with the present invention. In general, in one embodiment, the system 30 is comprised of an etch tool 10, a controller 34 and a model 38. The controller 34 is adapted to control a plurality of input parameters ($I_1$-$I_n$), indicated generally by the arrow 40, to control one or more aspects of the etching process performed in the etch tool 10. Such parameters may include, but should not be considered as limited to, one or more gas flow rates, temperature, pressure, power supplied to generate a plasma, the positioning of the schematically depicted wafer 16 within the etch tool 10, the DC power supplied to the illustrative wafer stage 14, wafer chuck temperature, wafer backside coolant gas flow, process duration, throttle valve position, electrode gap (the distance between the upper electrode and the wafer surface), wafer bias, etc. The controller 34 may be resident on the etch tool 10, it may be a stand-alone computer, or it may be part of a factory-wide computer system that is used to control the various processes within a semiconductor manufacturing plant.

Additional inputs may be provided to the controller 34 and/or model 38, such as wafer state data, tool state data and process state data, although such inputs are not expressly depicted in FIG. 2. For example, wafer state data may include parameters such as film thicknesses, critical dimensions and/or profiles of features, the height of features, the depth of features, the chemical composition of the layer to be etched in the tool 10, wafer temperature, etc. The tool state data may involve items such as RF power, DC power, pressure, electrode gap, etc. Process state data may include the plasma characteristics described above.

In one embodiment, the metrology tool 52 may be any type of tool capable of measuring a desired physical characteristic of the features formed by the etch process performed in the etch tool 10. The metrology tool 52 may be a stand-alone tool or it may be an integrated metrology tool capable of providing metrology data on wafers processed in the tool 10. In addition, metrology data can be provided by in situ metrology systems and sensors as the wafer is processed or with the process chamber itself. An illustrative substrate 53 having a plurality of schematically-depicted manufactured features 54 formed thereon is shown in FIG. 2. The metrology tool 52 may be, for example, a scatterometry tool or a scanning electron microscope (SEM). In another embodiment, the metrology tool 52 may be a tool capable of measuring the thickness of a process layer to be etched in the etch tool 10, e.g., an ellipsometer, a reflectometer, an interferometer, etc.

In the illustrated embodiments, the controller 34 is a computer programmed with software to implement the functions described herein. Moreover, the functions described for the controller 34 may be performed by one or more controllers spread through the system. For example, the controller 34 may be a fab level controller that is used to control processing operations throughout all or a portion of a semiconductor manufacturing facility. Alternatively, the controller 34 may be a lower level computer that controls only portions or cells of the manufacturing facility. Moreover, the controller 34 may be a stand-alone device, or it may reside on the etch tool 32 or elsewhere within the system. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 34, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

According to one illustrative embodiment of the present invention, one or more parameters or characteristics of the plasma 28 may be determined and that information may be used to control one or more parameters of the etching process performed in the etch tool 10. That is, one or more parameters of the etching process performed in the etch tool 10 may be varied based upon the characteristics of the plasma 28. In some cases, a model of the plasma state characteristics may be created and updated.

More specifically, the etching processes are very complex and may involve a number of interrelated factors, such as those identified in the preceding pages (e.g., pages 9-11). However, one or more characteristics of the plasma 28 may be associated with the desired end result of the etch process, i.e., producing features of the desired critical dimension and/or profile, final film thickness, "endpointing," uniformity, etc. Based upon this information, a target value or range of values may be established for the characteristic(s) of the plasma 28.

That is, the characteristic(s) of the plasma 28 may be used as a virtual sensor in performing etching processes on wafers in the etch tool 10.

The controller 34 may use the control model 38 in performing at least some of its activities. The model 38 may correlate one or more characteristics of the plasma 28 with a desired or target physical dimension of a feature such as a critical dimension of the feature or a profile of the feature that is to be formed on the wafer 16 in the tool 10. The control model 38 may be developed empirically using any of a variety of known linear or non-linear techniques. The model 38 may be a relatively simple equation-based model (e.g., linear, exponential, weighted average, etc.) or a more complex model, such as a neural network model, principal component analysis (PCA) model, or a projection to latent strictures (PLS) model. The specific implementation of the model 38 may vary depending upon the modeling technique selected. The model 38 may be generated by the controller 34 or, alternatively, it may be generated by a different processing resource (not shown) and stored on the controller 34 or another data storage resource (not shown) after being developed. The controller 34 may access the model 38 at any desired time.

The characteristics of the plasma 28 that may be determined and/or modeled may vary depending upon the particular application. A metric may be established for a single characteristic of the plasma 28 or a combination of such characteristics. For example, a unit-less product of the mean free path of electrons and the plasma density may be the characteristic metric that is selected with respect to the plasma 28 generated in the etch tool 10.

In one illustrative embodiment, any of the characteristics of the plasma 28 in the etch tool 10, or any combination thereof, may be correlated with acceptable metrology results for features formed during the etching process performed in the etch tool 10. For example, as shown in FIG. 2, the metrology tool 52 may be a scatterometry tool or scanning electron microscope that is used to determine a profile of the features formed during the etching process. Other metrology data, such as film thickness, uniformity, trench depth, feature height, etc., may also be obtained depending upon the particular application. The metrology data is provided to the controller 34 and/or model 38. In turn, the model 38 may be updated or created based upon this metrology data. As a very simplified example, the metrology data may produce results that establish that acceptable features are produced in the etch tool 10 when the selected metric, e.g., glow discharge intensity, a ratio of DC bias supplied to the wafer stage 14 to the RF power supplied to coil 22, etc., is maintained within a predetermined limit and/or above a minimum value, etc. The selected metric may be a single characteristic of the plasma 28 or a complex relationship among a plurality of such characteristics of the plasma 28.

In other embodiments, the characteristic of the plasma 28 generated in the tool 10 may be used to compensate for deficiencies in incoming wafers that are to be processed in the etch tool 10. For example, based upon metrology data obtained by the metrology tool 52, a model may be created wherein across-wafer variations in the etch process performed in the etch tool 10 may be determined. That is, based upon the metrology data obtained, it may be observed that when a particularly selected characteristic(s) or metric of the plasma 28 is below, at or above a certain value, the etching process performed in the etch tool 10 is more aggressive near an edge region of the wafer as compared to the center region of the wafer. In short, a metric may be established for this across-wafer etching profile or signature of the etch process.

Based upon this information, by monitoring the selected characteristic(s) or metric, the plasma 28 may be controlled in such a manner in an attempt to compensate for variations in incoming wafers. For example, if an upstream deposition process is producing a process layer that exhibits additional thickness near the edge region of the wafer as compared to the center regions of the wafer, one or more parameters of the etch process performed in the etch tool 10 may be controlled such that an identified plasma characteristic or metric is maintained at a value such that the etch process performed in the etch tool 10 exhibits the desired compensatory across-wafer etch profile, i.e., an etch profile wherein the etching process tends to etch at a faster rate on the edge region of the wafer. Conversely, if the deposition process produces a process layer that is thicker in the center region than intended, the parameters of the etch process may be controlled such that a selected characteristic or metric of the plasma is maintained at a value that is associated with a desired across-wafer etching profile wherein the etching process is faster at the center region of the wafer as compared to the edge region.

The metrology tool 52 may be used to update or create the model 38. Other types of metrology tools may be used depending upon the characteristic of the feature that is being examined. Simply put, the model 38 may be updated or trained based upon the metrology data obtained by the metrology tool 52 for various manufactured features 54 and one or more characteristics of the plasma 28 obtained during the etch processes used to form the manufactured features. The model 38 may be used to determine one or more characteristics or metrics of the plasma 28 associated with the manufactured features 54 that have a desired or acceptable physical dimension or profile. Through this process the model 38 may associate one or more characteristics or metrics of the plasma 28 used to form the manufactured features 54 with a target physical dimension or profile of the feature. As a result, target characteristics or metrics of the plasma 28 may be determined. This target characteristic or metric of the plasma 28 may be associated with a desirable or target physical aspect of the feature, e.g., a critical dimension, a profile, trench depth, feature height, film thickness, wafer uniformity, surface condition (smooth, rough, degree of nitridation, etc.), etc.

Figure 3:
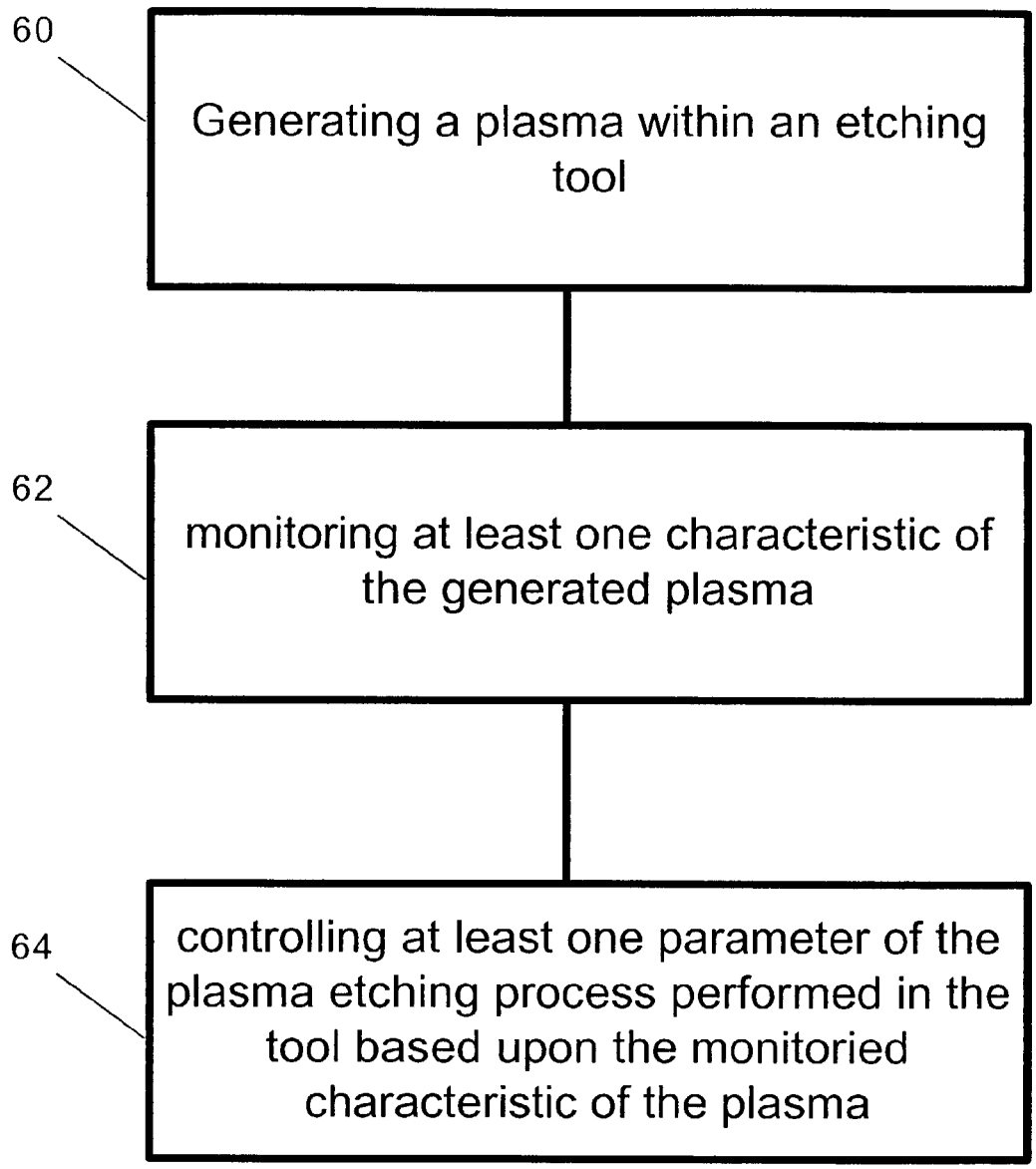
FIG. 3 is a flowchart depiction of one illustrative embodiment of the present invention.

FIG. 3 depicts one illustrative embodiment of the present invention in flowchart form. As shown therein, in one embodiment, a method according to the present invention comprises generating a plasma within an etching tool, as set forth at block 60, monitoring at least one characteristic of the generated plasma, as recited in block 62, and controlling at least one parameter of a plasma etching process performed in the tool based upon the monitored at least one characteristic of the plasma, as set forth at block 64.

In another illustrative embodiment, the method comprises generating a plasma within an etch tool, performing a plasma etching process within the etch tool, determining at least one characteristic of the plasma, and controlling at least one parameter of the etching process based upon a comparison of the determined at least one characteristic of the plasma and a target value for the determined at least one characteristic of the plasma. In other illustrative embodiments, a target metric for the plasma is established based upon a target critical dimension and/or profile, thickness, width, trench depth, etc. of a feature to be formed during the etch process, and the etch process is controlled such that the metric associated with at least one characteristic of the plasma is maintained within a preselected range of the target metric. The target metric may be a single value, a range of values, a ratio of such values and/or a combination of such values.

In even further embodiments, the etching process is controlled based upon the monitored characteristic(s) of the plasma such that the etching process performed in the etch tool exhibits a desired across-wafer etching pattern. In turn, this etch process may be used in an effort to compensate for thickness variations in process layers that are to be etched in the etch tool.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
generating a plasma within an etching tool having at least one wafer disposed therein;
monitoring at least one characteristic of said generated plasma, said at least one characteristic being indicative of at least one physical aspect of at least one feature formed on the wafer; and
controlling at least one parameter of a plasma etching process performed in said tool based upon said monitored at least one characteristic of said plasma, wherein controlling at least one parameter of a plasma etching process performed in said tool based upon said monitored at least one characteristic of said plasma comprises controlling at least one parameter of an anisotropic plasma etching process performed in said tool based upon said monitored at least one characteristic of said plasma.

2. A method, comprising:
generating a plasma within an etching tool having at least one wafer disposed therein;
monitoring at least one characteristic of said generated plasma, said at least one characteristic being indicative of at least one physical aspect of at least one feature formed on the wafer; and
controlling at least one parameter of a plasma etching process performed in said tool based upon said monitored at least one characteristic of said plasma, wherein controlling at least one parameter of a plasma etching process performed in said tool based upon said monitored at least one characteristic of said plasma comprises controlling at least one parameter of an isotropic plasma etching process performed in said tool based upon said monitored at least one characteristic of said plasma.

3. A method comprising:
generating a plasma within an etching tool having at least one wafer disposed therein;
monitoring at least one characteristic of said generated plasma, said at least one characteristic being indicative of at least one physical aspect of at least one feature formed on the wafer; and
controlling at least one parameter of a plasma etching process performed in said tool based upon said monitored at least one characteristic of said plasma, wherein controlling at least one parameter of a plasma etching process performed in said tool based upon said monitored at least one characteristic of said plasma comprises controlling at least one parameter of a plasma etching process performed in said tool based upon said monitored at least one characteristic of said plasma such that said plasma etch process exhibits a desired across-wafer etch pattern wherein said desired across-wafer etch pattern is an etch pattern, and wherein said plasma etch process etches at a faster rate at an edge region of a wafer as compared to the etch rate of the process at a center region of a wafer.

4. A method, comprising:
generating a plasma within an etching tool having at least one wafer disposed therein;
monitoring at least one characteristic of said generated plasma, said at least one characteristic being indicative of at least one physical aspect of at least one feature formed on the wafer; and
controlling at least one parameter of a plasma etching process performed in said tool based upon said monitored at least one characteristic of said plasma, wherein controlling at least one parameter of a plasma etching process performed in said tool based upon said monitored at least one characteristic of said plasma comprises controlling at least one parameter of a plasma etching process performed in said tool based upon said monitored at least one characteristic of said plasma such that said plasma etch process exhibits a desired across-wafer etch pattern wherein said desired across-wafer etch pattern is an etch pattern and wherein said desired across-wafer etch pattern is an etch pattern wherein said plasma etch process etches at a slower rate at an edge region of a wafer as compared to the etch rate of the process at a center region of a wafer.

5. A method, comprising:
generating a plasma within an etch tool having at lest one wafer disposed therein;
performing a plasma etching process within said etch tool;
determining at least one characteristic of said plasma, said at least one characteristic being indicative of at least one physical aspect of at least one feature formed on the wafer; and
controlling at least one parameter of said etching process based upon a comparison of said determined at least one characteristic of said plasma and a target value for said determined at least one characteristic of said plasma, wherein controlling at least one parameter of a plasma etching process performed in said tool based upon said monitored at least one characteristic of said plasma comprises controlling at least one parameter of a plasma etching process performed in said tool based upon said monitored at least one characteristic of said plasma such that said plasma etch process exhibits a desired across-wafer etch pattern and wherein said desired across-wafer etch pattern is an etch pattern wherein said plasma etch process etches at a faster rate at an edge region of a wafer as compared to the etch rate of the process at a center region of a wafer.

6. A method, comprising:
generating a plasma within an etch tool having at lest one wafer disposed therein;
performing a plasma etching process within said etch tool;
determining at least one characteristic of said plasma, said at least one characteristic being indicative of at least one physical aspect of at least one feature formed on the wafer; and
controlling at least one parameter of said etching process based upon a comparison of said determined at least one characteristic of said plasma and a target value for said determined at least one characteristic of said plasma, wherein controlling at least one parameter of a plasma etching process performed in said tool based upon said monitored at least one characteristic of said plasma comprises controlling at least one parameter of a plasma etching process performed in said tool based upon said monitored at least one characteristic of said plasma such that said plasma etch process exhibits a desired across-wafer etch pattern and wherein said desired across-wafer etch pattern is an etch pattern wherein said plasma etch process etches at a slower rate at an edge region of a wafer as compared to the etch rate of the process at a center region of a wafer.

7. A method comprising:

generating a plasma within an etch tool;

performing a plasma etching process within said etch tool to define at least one feature in or above a semiconducting substrate;

determining a metric for said plasma, said metric being based upon at least one characteristic of said plasma; and controlling at least one parameter of said etching process based upon a comparison of said determined metric and a target metric for said plasma, said target metric being associated with at least one of a target profile, a target critical dimension a target depth, a target height, and a target thickness for said at least one feature, wherein controlling at least one parameter of said etching process based upon said determined metric and said target metric for said plasma comprises controlling at least one parameter of said etching process such that said plasma etch process exhibits a desired across-wafer etch pattern, and wherein said desired across-wafer etch pattern is an etch pattern wherein said plasma etch process exhibits varying etch rates across a surface of said wafer.

8. A method, comprising:

generating a plasma within an etch tool;

performing a plasma etching process within said etch tool to define at least one feature in or above a semiconducting substrate;

determining a metric for said plasma, said metric being based upon at least one characteristic of said plasma; and controlling at least one parameter of said etching process based upon a comparison of said determined metric and a target metric for said plasma, said target metric being associated with at least one of a target profile, a target critical dimension, a target depth, a target height, and a target thickness for said at least one feature, wherein controlling at least one parameter of said etching process based upon said determined metric and said target metric for said plasma comprises controlling at least one parameter of said etching process such that said plasma etch process exhibits a desired across-wafer etch pattern, and wherein said desired across-wafer etch pattern is an etch pattern wherein said plasma etch process etches at a faster rate at an edge region of a wafer as compared to the etch rate of the process at a center region of a wafer.

9. A method, comprising:

generating a plasma within an etch tool;

performing a plasma etching process within said etch tool to define at least one feature in or above a semiconducting substrate;

determining a metric for said plasma, said metric being based upon at least one characteristic of said plasma; and controlling at least one parameter of said etching process based upon a comparison of said determined metric and a target metric for said plasma, said target metric being associated with at least one of a target profile, a target critical dimension, a target depth, a target height and a target thickness for said at least one feature, wherein controlling at least one parameter of said etching process based upon said determined metric and said target metric for said plasma comprises controlling at least one parameter of said etching process such that said plasma etch process exhibits a desired across-wafer etch pattern, and wherein said desired across-wafer etch pattern is an etch pattern wherein said plasma etch process etches at a slower rate at an edge region of a wafer as compared to the etch rate of the process at a center region of a wafer.

* * * * *